(12) United States Patent
Cabatbat et al.

(10) Patent No.: US 11,652,078 B2
(45) Date of Patent: May 16, 2023

(54) HIGH VOLTAGE SEMICONDUCTOR PACKAGE WITH PIN FIT LEADS

(71) Applicant: Infineon Technologies AG, Neubiberg (DE)

(72) Inventors: Edmund Sales Cabatbat, Roxas (PH); Thai Kee Gan, Melaka (MY); Kean Ming Koe, Penang (MY); Ke Yan Tean, Melaka (MY)

(73) Assignee: Infineon Technologies AG, Neubiberg (DE)

( * ) Notice: Subject to any disclaimer, the term of this patent is extended or adjusted under 35 U.S.C. 154(b) by 74 days.

(21) Appl. No.: 17/234,964

(22) Filed: Apr. 20, 2021

(65) Prior Publication Data

US 2022/0336401 A1 Oct. 20, 2022

(51) Int. Cl.
*H01L 23/00* (2006.01)
*H01L 25/065* (2023.01)
*H01L 23/31* (2006.01)
(Continued)

(52) U.S. Cl.
CPC .............. *H01L 24/40* (2013.01); *H01L 23/13* (2013.01); *H01L 23/14* (2013.01); *H01L 23/3157* (2013.01); *H01L 23/49548* (2013.01); *H01L 24/37* (2013.01); *H01L 25/0655* (2013.01); *H01L 2224/37005* (2013.01); (Continued)

(58) Field of Classification Search
CPC ......... H01L 24/40; H01L 23/13; H01L 23/14; H01L 23/3157; H01L 23/49548; H01L 24/37; H01L 25/0655; H01L 2224/37005; H01L 2224/37012; H01L 2224/4023; H01L 2924/1815; H01L 2924/182; H01L 2924/381; H01L 23/28; H01L 23/31; H01L 23/3107; H01L 23/3114; H01L 23/495; H01L 23/49503; H01L 23/4951; H01L 23/4952; H01L 23/49524; H01L 23/49541; H01L 24/49548; H01L 24/34;
(Continued)

(56) References Cited

U.S. PATENT DOCUMENTS 8,952,520 B2 * 2/2015 Obiraki ................... H01L 24/34
257/693
10,236,231 B2 * 3/2019 Miyakoshi ............. H01L 24/40
(Continued)

FOREIGN PATENT DOCUMENTS

WO 2014159469 A1 10/2014

*Primary Examiner* — Eduardo A Rodela
(74) *Attorney, Agent, or Firm* — Murphy, Bilak & Homiller, PLLC

(57) ABSTRACT

A semiconductor package includes a die pad, a semiconductor die mounted on the die pad and comprising a first terminal facing away from the die pad and a second terminal facing and electrically connected to the die pad, an interconnect clip electrically connected to the first terminal, an encapsulant body of electrically insulating material that encapsulates the semiconductor die and the interconnect clip, and a first opening in the encapsulant body that exposes a surface of the interconnect clip, the encapsulant body comprises a lower surface, an upper surface opposite from the lower surface, and a first outer edge side extending between the lower surface and the upper surface, and the first opening is laterally offset from the first outer edge side.

17 Claims, 15 Drawing Sheets

(51) Int. Cl.
*H01L 23/495* (2006.01)
*H01L 23/14* (2006.01)
*H01L 23/13* (2006.01)

(52) U.S. Cl.
CPC ............... *H01L 2224/37012* (2013.01); *H01L 2224/4023* (2013.01); *H01L 2924/182* (2013.01); *H01L 2924/1815* (2013.01); *H01L 2924/381* (2013.01)

(58) Field of Classification Search
CPC . H01L 24/42; H01L 29/0696; H01L 29/1095; H01L 29/66325; H01L 29/7393; H01L 29/7395
See application file for complete search history.

(56) References Cited

U.S. PATENT DOCUMENTS

| | | | |
|---|---|---|---|
| 2005/0023658 A1* | 2/2005 | Tabira | H01L 24/37 257/E23.044 |
| 2005/0224945 A1* | 10/2005 | Saito | H01L 23/49575 257/E23.052 |
| 2007/0215999 A1* | 9/2007 | Kashimoto | H01L 24/49 257/E21.504 |
| 2007/0278664 A1* | 12/2007 | Carney | H01L 24/73 257/E23.044 |
| 2008/0173991 A1 | 7/2008 | Cruz et al. | |
| 2008/0246130 A1* | 10/2008 | Carney | H01L 23/49568 257/E23.101 |
| 2010/0007026 A1* | 1/2010 | Shikano | H01L 25/18 257/773 |
| 2010/0013086 A1* | 1/2010 | Obiraki | H01L 23/3735 257/E23.116 |
| 2010/0164078 A1 | 7/2010 | Madrid et al. | |
| 2013/0056885 A1 | 3/2013 | Minamio et al. | |
| 2013/0307130 A1* | 11/2013 | Oga | H01L 23/49524 257/666 |
| 2018/0068935 A1 | 3/2018 | Teysseyre et al. | |
| 2020/0303215 A1* | 9/2020 | Ichikawa | H01L 25/18 |
| 2021/0125887 A1* | 4/2021 | Inaba | H01L 23/49513 |

\* cited by examiner

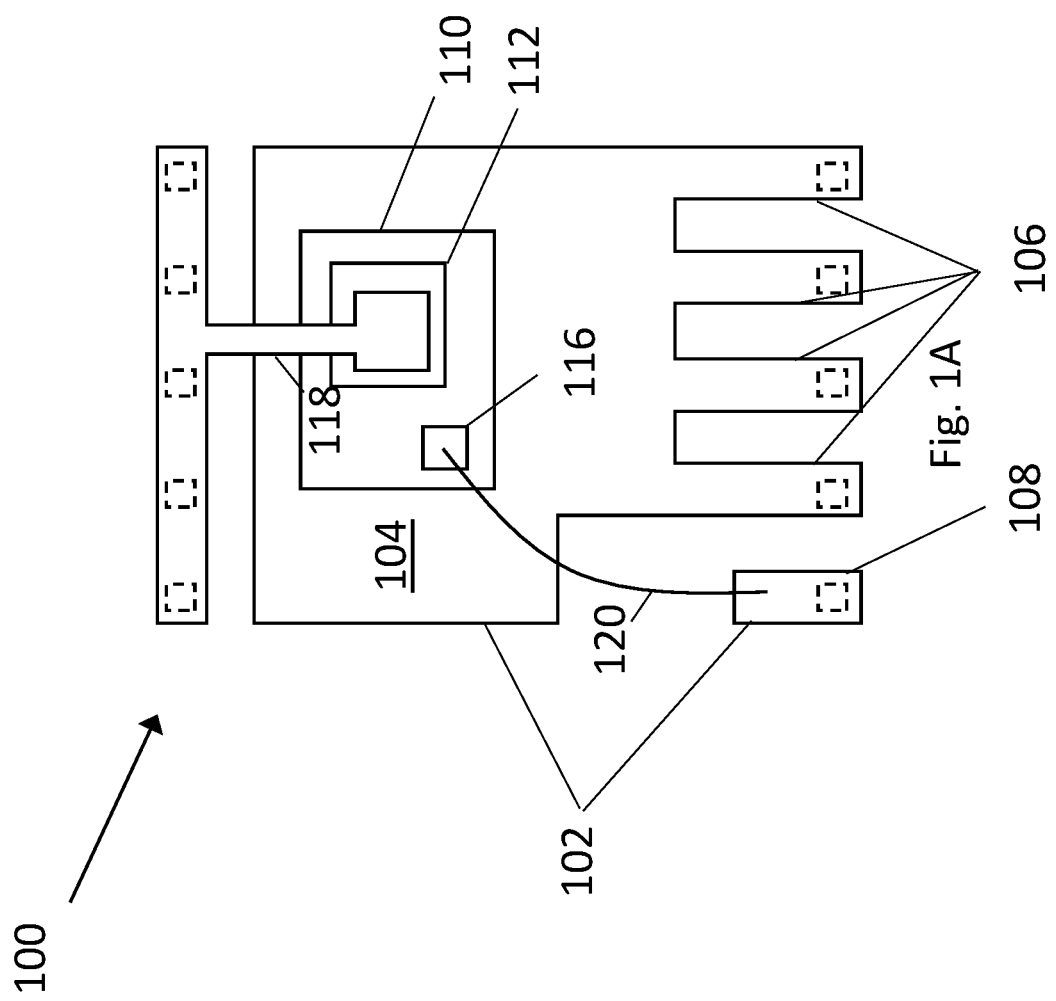

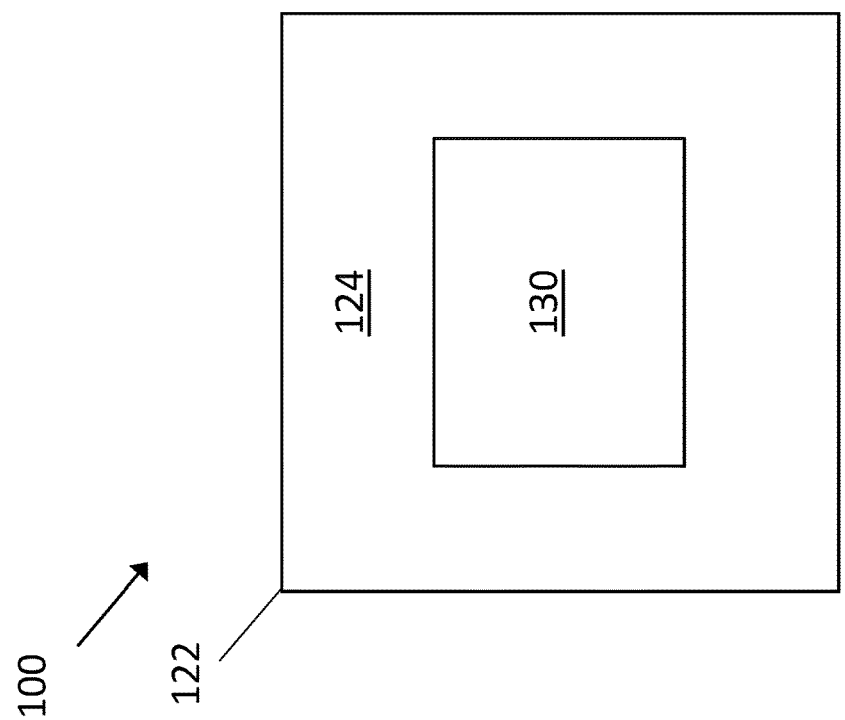
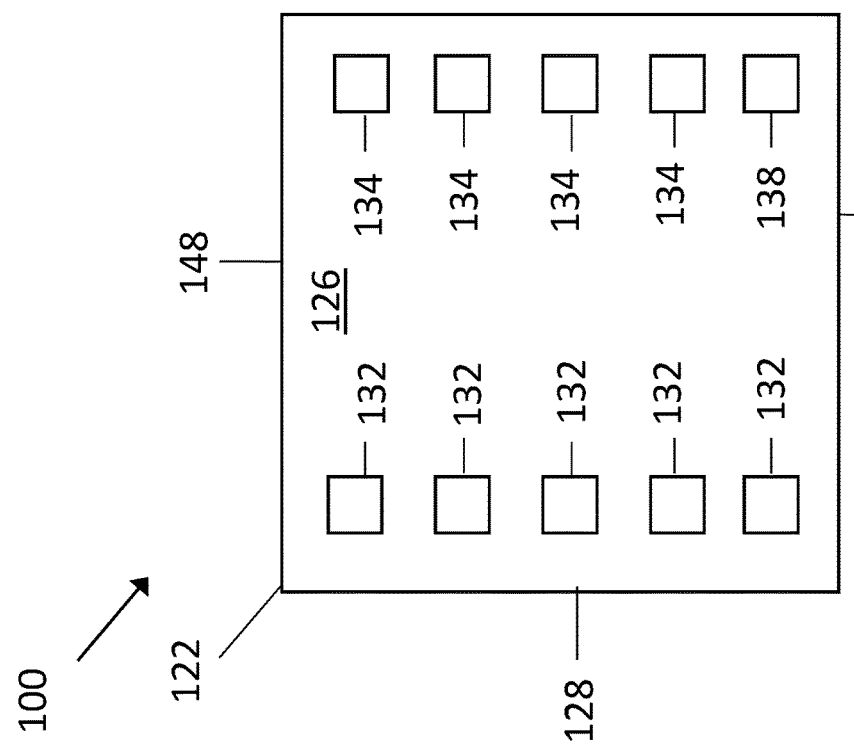

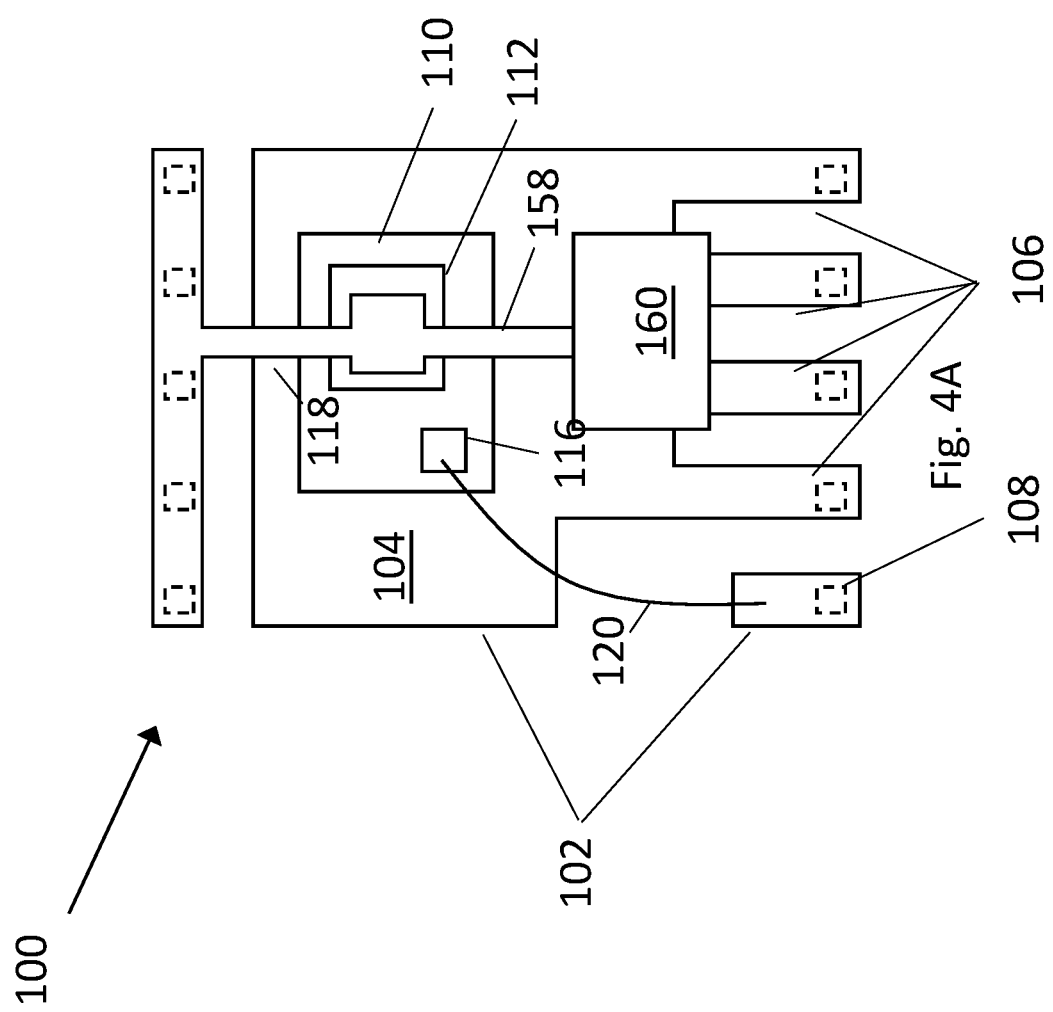

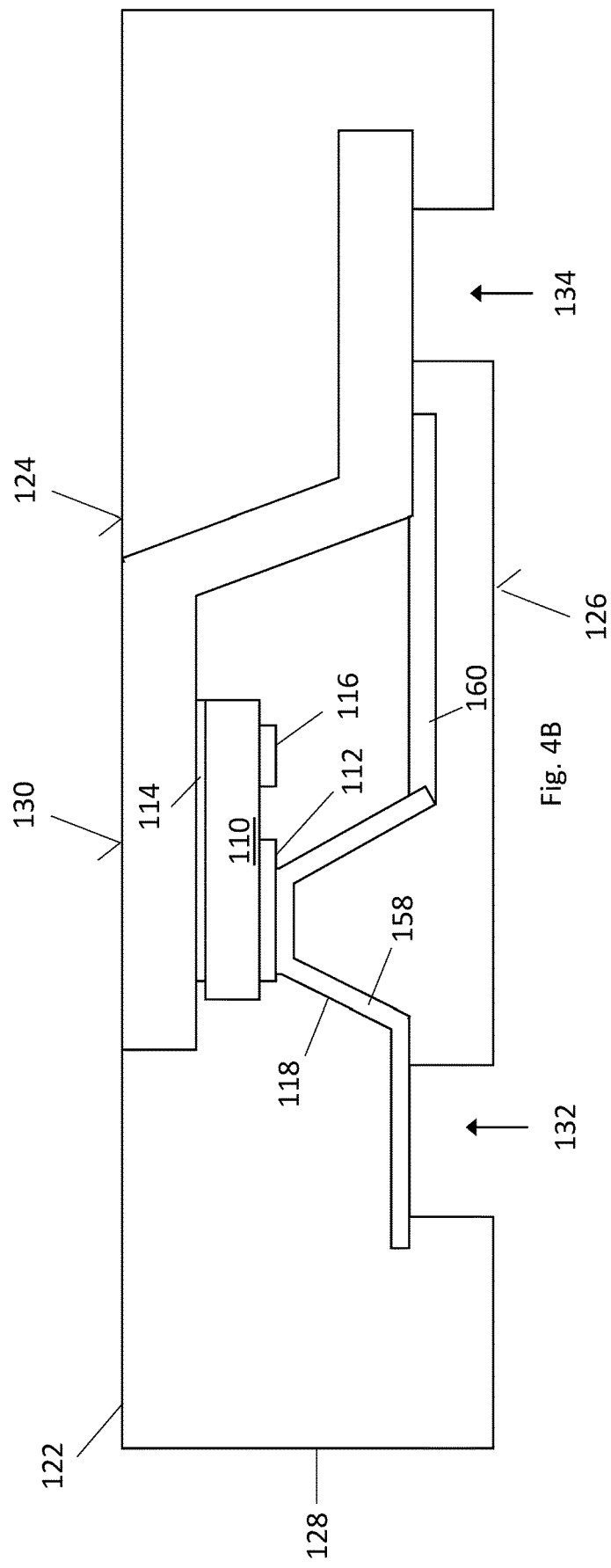

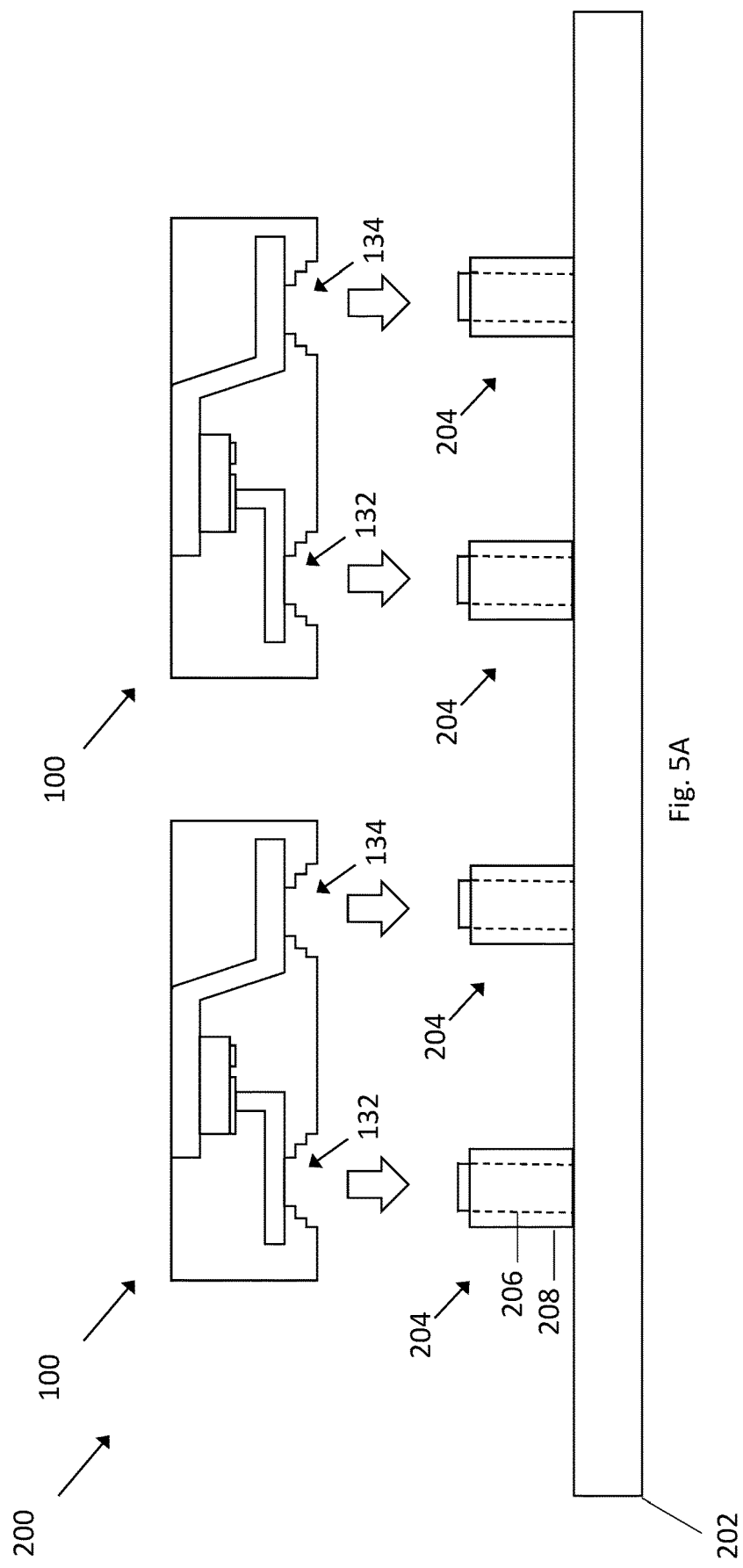

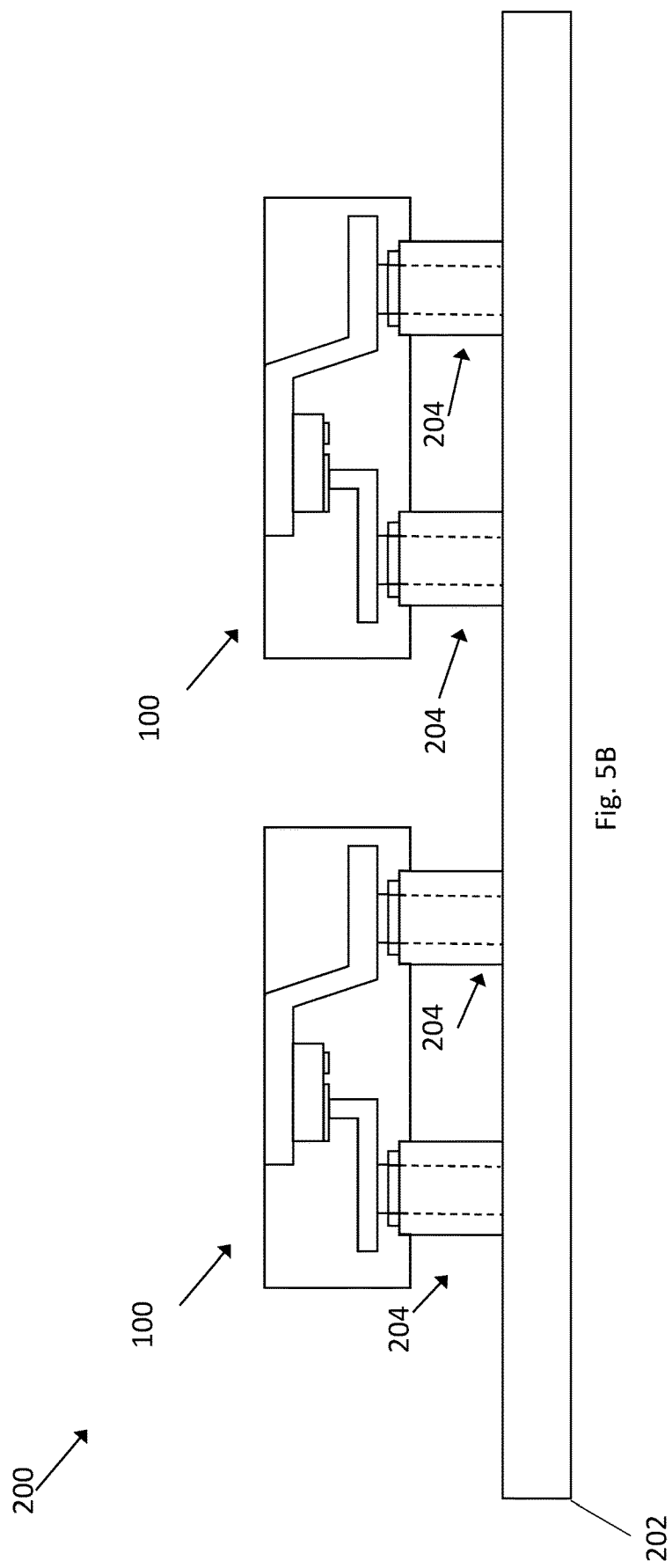

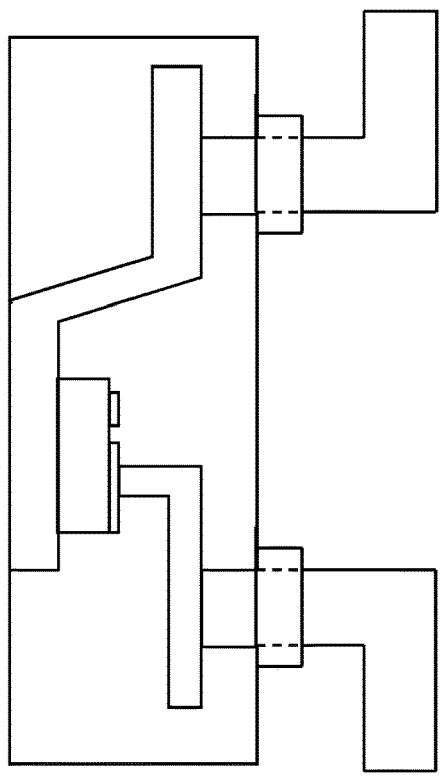
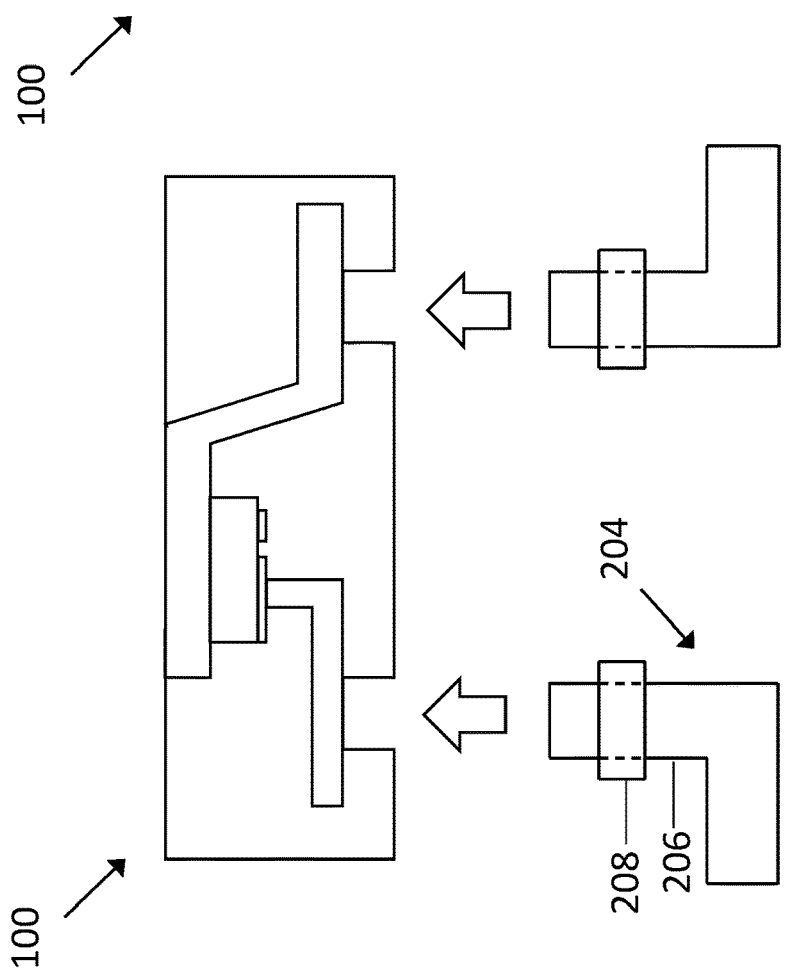
Fig. 7B
Fig. 7A

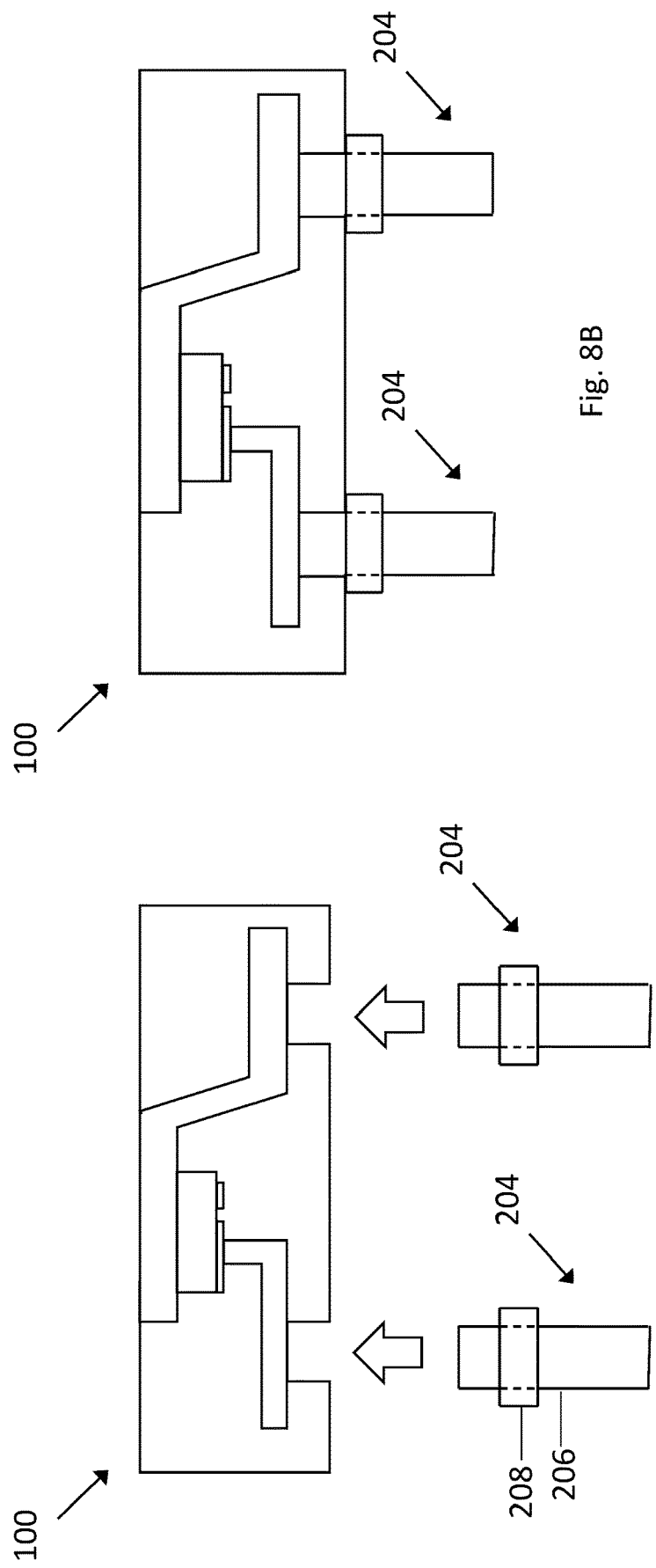

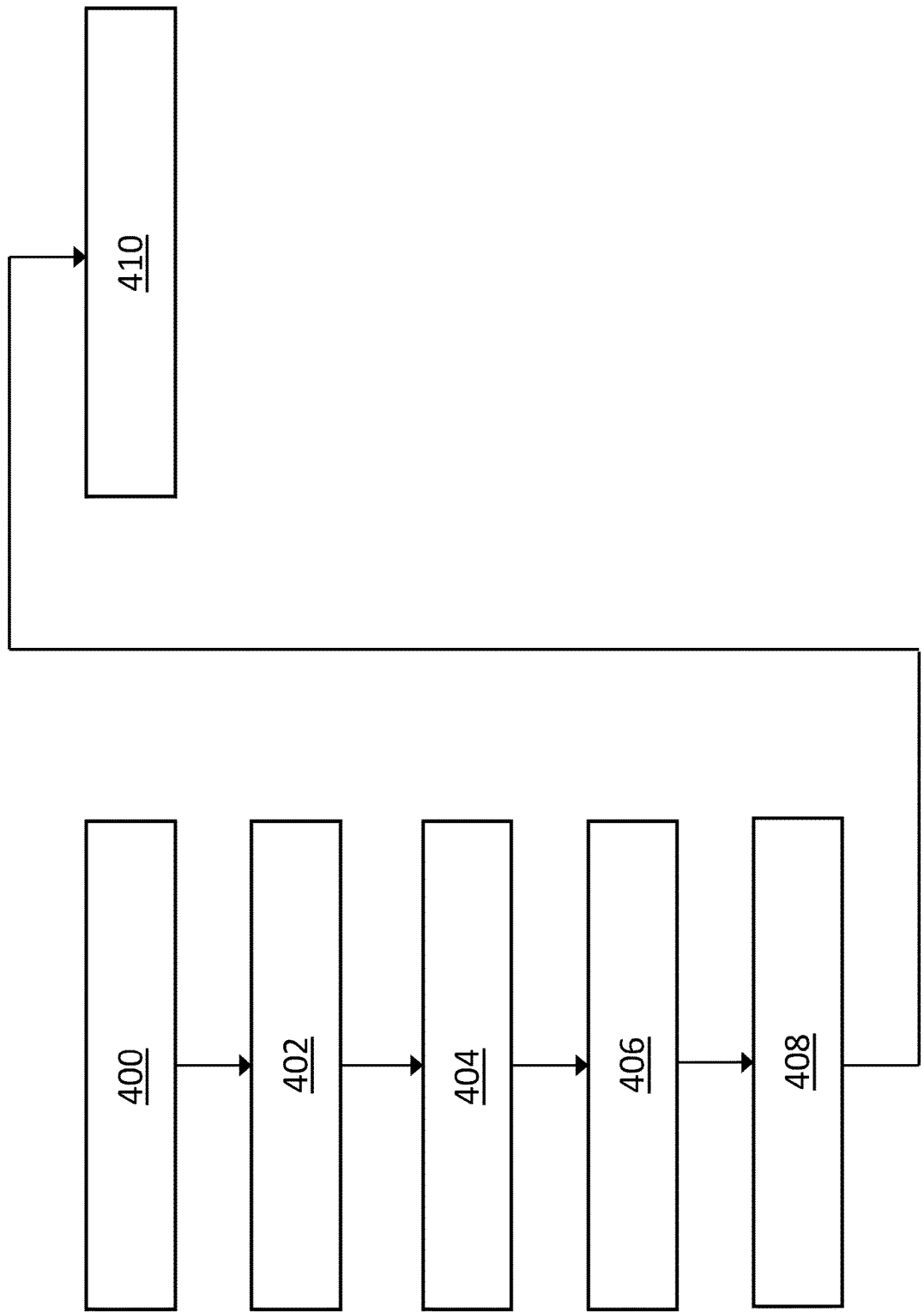

HIGH VOLTAGE SEMICONDUCTOR PACKAGE WITH PIN FIT LEADS

TECHNICAL FIELD

The instant application relates to semiconductor devices, and more particularly relates to semiconductor packages for high voltage applications.

BACKGROUND

High voltage semiconductor devices such as MOSFETs (metal oxide semiconductor field effect transistors), IGBTs (insulated gate bipolar transistors) and HEMTs (high electron mobility transistors) are provided in a semiconductor package. The semiconductor package includes a protective insulating body and conductive leads or contacts that provide externally accessible points of electrical contact to the terminals of the semiconductor die. In high voltage applications an important design consideration for semiconductor packages is creepage distance. The leads or contacts of the semiconductor package that accommodate high voltages, e.g., on the order of 100V, 500V, 1000V or more, during normal operation of the device require large creepage distances to prevent unwanted arcing and/or device failure. However, increasing the creepage distance between leads or contacts of a semiconductor package conflicts with an overall desire to make semiconductor packages as small as possible.

SUMMARY

Those skilled in the art will recognize additional features and advantages upon reading the following detailed description, and upon viewing the accompanying drawings.

A semiconductor package is disclosed. According to an embodiment, the semiconductor package comprises: a die pad, a semiconductor die mounted on the die pad and comprising a first terminal facing away from the die pad and a second terminal facing and electrically connected to the die pad, an interconnect clip electrically connected to the first terminal, an encapsulant body of electrically insulating material that encapsulates the semiconductor die and the interconnect clip, and a first opening in the encapsulant body that exposes a surface of the interconnect clip, wherein the encapsulant body comprises a lower surface, an upper surface opposite from the lower surface, and a first outer edge side extending between the lower surface and the upper surface, wherein the first opening is laterally offset from the first outer edge side.

Separately or in combination, an outer surface of the die pad is exposed from the upper surface, and the first opening extends from the lower surface into the encapsulant body.

Separately or in combination, an end of the outer surface of the die pad is laterally spaced apart from the first outer edge side, and a creepage distance between the outer surface of the die pad that is exposed and the exposed surface of the interconnect clip comprises a distance between the end of the die pad and the first outer edge side along the upper surface, a distance between the upper surface and the lower surface along the first outer edge side, and a distance between the first outer edge side and the first opening along the lower surface.

Separately or in combination, the creepage distance further comprises a distance between the lower surface and the interconnect clip along a first sidewall of the first opening that is nearest to the first outer edge side.

Separately or in combination, the first sidewall comprises one or more step-shaped transitions, and each of the one or more step-shaped transitions comprise an angled intersection between planar surfaces of the encapsulant body.

Separately or in combination, the encapsulant body comprises a wider section and a narrower section on top of the wider section, and the creepage distance comprises a distance along one or more surfaces of the encapsulant body that form a transition between the wider section and the narrower section.

Separately or in combination, the semiconductor package further comprises a first conductive lead that is continuously connected to the die pad and comprises a lateral span that is vertically offset from the die pad, and a second opening in the encapsulant body that exposes a surface of the first lead in the lateral span, and the second opening extends from the lower surface into the encapsulant body.

Separately or in combination, the encapsulant body comprises a second outer edge side extending between the lower surface and the upper surface and opposite from the first outer edge side, and the second opening is laterally offset from the second outer edge side.

Separately or in combination, the first and second openings each comprise opposite facing sidewalls, the sidewalls of the first and second openings comprise one or more step-shaped transitions, and each of the one or more step-shaped transitions comprise an angled intersection between planar surfaces of the encapsulant body.

Separately or in combination, the interconnect clip comprises a first section that is electrically conductive and a second section that is electrically insulating, the first section is electrically connected to the first terminal and comprises the surface that is exposed by the first opening, and the second section contacts the lateral span of the first conductive lead.

Separately or in combination, the semiconductor die is a discrete power device, and the first terminal and the second terminal are voltage blocking terminals of the semiconductor die.

A semiconductor device assembly is disclosed. According to an embodiment, the semiconductor device assembly comprises a semiconductor package, comprising a die pad, a semiconductor die mounted on the die pad and comprising a first terminal facing away from the die pad and a second terminal facing and electrically connected to the die pad, an interconnect clip electrically connected to the first terminal, an encapsulant body of electrically insulating material that encapsulates the semiconductor die and the interconnect clip, and a first opening in the encapsulant body that exposes a surface of the interconnect clip; and a first connector that is attachable to the semiconductor package, and the first connector is configured be inserted in the first opening and form a conductive connection with the surface of the interconnect clip that is exposed from the encapsulant body in an attached position.

Separately or in combination, the first connector comprises an electrically conductive post that contacts the surface of the interconnect clip in the attached position.

Separately or in combination, the first connector further comprises an electrically insulating sleeve that surrounds the electrically conductive post, and in the attached position the electrically insulating sleeve engages with opposite facing sidewalls of the first opening.

Separately or in combination, the first opening comprises opposite facing sidewalls, the opposite facing sidewalls comprise one or more step-shaped transitions, each of the one or more step-shaped transitions comprise an angled intersection between planar surfaces of the encapsulant body, and the electrically insulating sleeve engages with the opposite facing sidewalls in a widest portion of the first opening.

Separately or in combination, the encapsulant body comprises a lower surface, an upper surface opposite from the lower surface, and a first outer edge side extending between the lower surface and the upper surface, an outer surface of the die pad is exposed from the upper surface of the encapsulant body, and a creepage distance between the outer surface of the die pad that is exposed from the encapsulant body the die pad and the exposed surface of the interconnect clip comprises a distance between an end of the die pad and the first outer edge side along the upper surface, a distance between the upper surface and the lower surface along the first outer edge side, and a distance between the first outer edge side and the first opening along the lower surface.

Separately or in combination, the semiconductor device assembly further comprises a circuit carrier that comprises an electrically insulating substrate and a structured metallization layer, and the first connector forms an electrical connection between the interconnect clip and the structured metallization layer.

Separately or in combination, the first connector is an integrally formed element of the circuit carrier.

Separately or in combination, the first connector is a standalone element that is separate from the circuit carrier and the semiconductor package.

Separately or in combination, the semiconductor package further comprises a first conductive lead that is continuously connected to the die pad and comprises a lateral span that is vertically offset from the die pad, and a second opening in the encapsulant body that exposes a surface of the lateral span, the semiconductor device assembly further comprises a second connector that is attachable to the semiconductor package and comprises a second electrically conductive post, and the second connector is configured be inserted in the second opening and form a second conductive connection with a surface of the first conductive lead in the attached position.

BRIEF DESCRIPTION OF THE DRAWINGS

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

FIG. 1, which includes FIGS. 1A, 1B, 1C and 1D depicts a semiconductor package, according to an embodiment. FIG. 1A depicts the interior elements of the semiconductor package from a plan-view perspective; FIG. 1B depicts the semiconductor package from a side-view perspective with the interior elements being visible; FIG. 1C depicts the exterior of the semiconductor package from a plan-view perspective over a lower surface of the semiconductor package; and FIG. 1D depicts the exterior of the semiconductor package from a plan-view perspective over an upper surface of the semiconductor package.

FIG. 4, which includes FIGS. 4A and 4B depicts a semiconductor package, according to another embodiment. FIG. 4A depicts the interior elements of the semiconductor package from a plan-view perspective; and FIG. 4B depicts the semiconductor package from a side-view perspective with the interior elements being visible.

FIG. 5, which includes FIGS. 5A and 5B, depicts a semiconductor device assembly that comprises a circuit carrier, conductive connectors and a semiconductor package, according to an embodiment. FIG. 5A depicts the assembly prior to insertion of the connectors into openings of the semiconductor package; and FIG. 5B depicts the assembly after insertion of the connectors into openings of the semiconductor package.

FIG. 7, which includes FIGS. 7A and 7B, depicts a semiconductor device assembly that comprises a semiconductor package and conductive connectors, according to an embodiment. FIG. 7A depicts the assembly prior to insertion of the connectors into openings of the semiconductor package; and FIG. 7B depicts the assembly after insertion of the connectors into openings of the semiconductor package.

FIG. 8, which includes FIGS. 8A and 8B, depicts a semiconductor device assembly that comprises a semiconductor package and conductive connectors, according to another embodiment. FIG. 8A depicts the assembly prior to insertion of the connectors into openings of the semiconductor package; and FIG. 8B depicts the assembly after insertion of the connectors into openings of the semiconductor package.

FIG. 9, which includes FIG. 9A depicts a plurality of conductive connectors attached to a peripheral ring; and FIG. 9B depicts the conductive connectors detached from the peripheral ring.

FIG. 10 depicts a process flow for forming a semiconductor package and inserting conductive connectors into openings of the semiconductor package, according to an embodiment.

DETAILED DESCRIPTION

Embodiments of a semiconductor package with an advantageously high creepage distance relative to overall semiconductor package size are described herein. The high creepage distance results a large distance between an exposed die pad at an upper surface of the semiconductor package and an exposed interconnect clip at a lower surface of the semiconductor package. The exposed interconnect clip is contacted by insertable conductive connectors that are inserted into openings in the lower surface of the semiconductor package. Advantageously, three sides of the semiconductor package contribute to the creepage distance between the exposed die pad at the upper surface of the semiconductor package and the exposed interconnect clip at the lower surface of the semiconductor package. The creepage distance between voltage blocking terminals of the device can therefore advantageously include the complete length of an outer edge side of the package and a lateral offset distance between the outer edge side and the openings that receive the insertable conductive connectors.

Figure 1B:
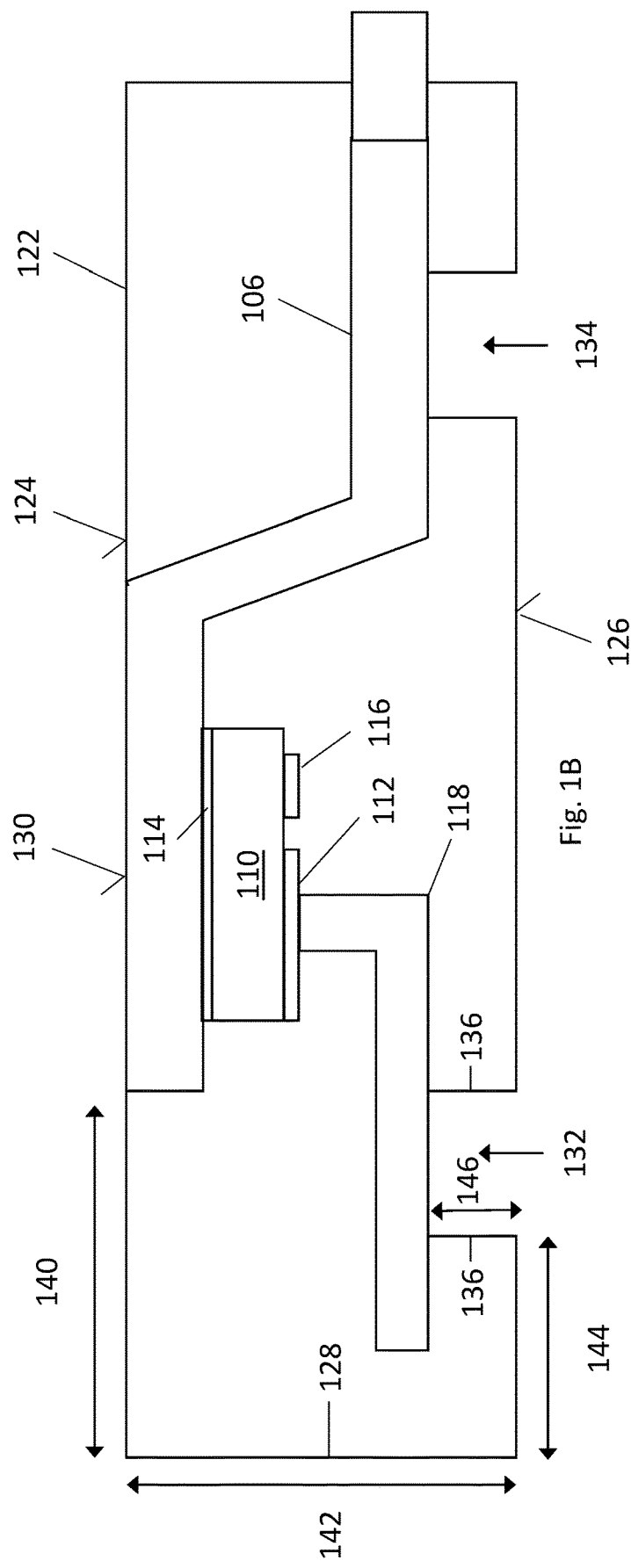

Referring to FIG. 1, a semiconductor package 100 is depicted, according to an embodiment. As shown in FIG. 1A, the semiconductor package 100 comprises a lead frame 102. The lead frame 102 comprises an electrically conductive material such as Cu (copper), Ni (Nickel), NoP (nickel phosphorous), Ag (Silver), Pd (palladium), Au (gold), etc., and alloys or combinations thereof. The lead frame 102 can be provided by a substantially planar sheet of metal, e.g., a sheet comprising any one or more of the above-listed materials, and the geometric features of the lead frame 102 shown and described herein can be provided by performing metal processing techniques such as stamping, punching, etching, bending, etc., on this planar sheet of metal. The lead frame 102 includes a die pad 104 that comprises a generally planar die attach surface. The lead frame 102 additionally includes a number of leads that extend away from the die pad 104. As shown, the lead frame comprises a group of first leads 106 and a second lead 108. Each of the leads in the group of first leads 106 are continuously connected to the die pad 104. The second lead 108 is disconnected from the die pad 104. As shown in FIG. 1B, the lead frame 102 may have a so-called downset configuration. According to this configuration, the group of first leads 106 bend downward as they approach the die pad 104 such that the die pad 104 is disposed along a different vertical plane as the first leads 106.

As shown in FIGS. 1A-1B, semiconductor package 100 further comprises a semiconductor die 110 mounted on the die pad 104. Generally speaking, the semiconductor die 110 can have a wide variety of device configurations. Examples of these device configurations include discrete devices such as MOSFETs (metal oxide semiconductor field effect transistors), IGBTs (insulated gate bipolar transistors) and HEMTs (high electron mobility transistors), JFETs (junction field effect transistors), diodes, etc. Additional examples of these device configurations include integrated circuit devices such as controllers, drivers, amplifiers, processors, sensors, etc. The semiconductor die 110 can comprise a type IV semiconductor material, e.g., silicon, silicon germanium, silicon carbide, etc., and/or a type III-V semiconductor material, e.g., gallium nitride, gallium arsenide, etc. The semiconductor die 110 may be configured as a vertical device that is configured to control a current flowing between opposite facing main and rear surfaces. Alternatively, the semiconductor die 110 may be configured as a lateral device that is configured to control a current flowing parallel to a main surface of the semiconductor die 110.

According to an embodiment, the semiconductor die 110 is configured as a discrete power device. A discrete power device is a device that is rated to control large voltages of at least 100V and more commonly on the order of 500V or more and/or large currents of at least 1A and more commonly on the order of 10A or more. Discrete power devices include transistors, e.g., MOSFETs (Metal Oxide Semiconductor Field Effect Transistors), IGBTs (Insulated Gate Bipolar Transistors), and HEMTs (High Electron Mobility Transistors), diodes, JFETs (Junction Field Effect Transistors), etc. In a specific example of a discrete power device, the semiconductor die 110 is configured as a silicon carbide based MOSFET that is rated to control a voltage of 1200V.

The semiconductor die 110 may comprise number of conductive bond pads on either one or both of the main surface and the rear surface of the semiconductor die 110. These conductive bond pads are configured as the device terminals of the semiconductor die 110. In the depicted embodiment, the semiconductor die 110 comprises a first terminal 112 disposed on a main surface of the semiconductor die 110 that faces away from the die pad 104 and a second terminal 114 (shown in FIG. 1B) disposed on a rear surface of the semiconductor die 110 that faces the die pad 104. The second terminal 114 is electrically connected to the die pad 104. This electrical connection may comprise a conductive adhesive, e.g., solder, sinter, conductive glue, diffusion solder, etc. According to an embodiment, the first terminal 112 and the second terminal 114 are voltage blocking terminals of the semiconductor die 110. The voltage blocking terminals of the semiconductor die 110 are the terminals that control a load voltage. For example, the voltage blocking terminals can be the drain and source terminals in the case of a MOSFET, emitter and collector terminal in the case of an IGBT, and so forth. In this embodiment, the first terminal 112 can be either one of the voltage blocking terminals (e.g., source, drain, collector, emitter, anode, cathode, etc.) and the second terminal 114 is the opposite one of the voltage blocking terminals (e.g., drain, source, emitter, collector, anode, cathode, etc.). In the depicted embodiment, the semiconductor die 110 additionally comprises a third terminal 116 disposed on the main surface of the semiconductor die 110. The third terminal 116 may be a control terminal that is configured to control a conductive connection between the first and second terminals 112, 114, e.g., a gate terminal.

The semiconductor package 100 further comprises an interconnect clip 118. The interconnect clip 118 comprises an electrically conductive material such as Cu (copper), Ni (Nickel), NiP (nickel phosphorous), Ag (Silver), Pd (palladium), Au (gold), etc., and alloys or combinations thereof. The interconnect clip 118 can be provided by a substantially planar sheet of metal that comprises any one or more of the above-listed materials, and the geometric features of the interconnect clip 118 shown and described herein can be provided by performing metal processing techniques such as stamping, punching, etching, bending, etc. The interconnect clip 118 is electrically connected to the first terminal 112 of the semiconductor die 110. This electrical connection may comprise a conductive adhesive, e.g., solder, sinter, conductive glue, diffusion solder, etc.

The semiconductor package 100 further comprises a conductive bond wire 120 (shown in FIG. 1A) that is electrically connected between the third terminal 116 and the second lead 108. More generally, the semiconductor package 100 may comprise any one or more different types of interconnect elements, e.g., bond wires, metal clip, ribbons, etc. to effectuate any necessary electrical interconnection.

The semiconductor package 100 additionally comprises an encapsulant body 122 (shown in FIGS. 1B-1D). The encapsulant body 122 comprises an electrically insulating encapsulant material that seals and protects the semiconductor die 110 and associated electrical connections including the electrical connection with the interconnect clip 118. Examples of this encapsulant material include, mold compound, thermosetting plastic, epoxy, resins, laminate materials, etc. The encapsulant body 122 may be formed by a molding process such as injection molding, compression molding, transfer molding, etc. In another embodiment, the encapsulant body 122 is formed by a lamination technique wherein a plurality of laminate layers are successively stacked on top of one another. The encapsulant body 122 comprises an upper surface 124, a lower surface 126 that is opposite the upper surface 124, and a first outer edge side 128 that extends between the upper and lower surfaces 124, 126. An outer surface 130 of the die pad 104 that is opposite from the semiconductor die 110 is exposed from the upper surface 124 of the encapsulant body 122. The exposed outer surface die pad 104 may be coplanar or substantially coplanar with the upper surface 124 of the semiconductor die 110, thus the exposed die pad 104 to be mated with an external heat sink.

The semiconductor package 100 additionally comprises a first opening 132 that exposes a surface of the interconnect clip 118 from the encapsulant body 122 and a second opening 134 that exposes a surface of the first lead 106 in the lateral span of the first lead 106 that is elevated from the die pad 104. The first and second openings 132, 134 are trench-like structures that extend from the lower surface 126 into the encapsulant body 122. The first opening 132 comprises opposite facing sidewalls 136 that extend from the lower surface 126 of the encapsulant body 122 to a surface of the interconnect clip 118 that is exposed by the first opening 132. The second opening 134 likewise comprises opposite facing sidewalls 136 that extend from the lower surface 126 of the encapsulant body 122 to the surface of the first lead 106 that is exposed from the second opening 134. In the depicted embodiment, the sidewalls 136 are substantially perpendicular to the lower surface 126 of the encapsulant body 122. More generally, the openings can have a variety of geometries, e.g., tapered geometries, curved surfaces, etc. The semiconductor package 100 may additionally comprise a third opening 138 (shown in FIG. 1C) that has a similar configuration as the first and second openings 132, 134 and exposes a surface of the second lead 108.

The first, second and third openings 132, 134 and 138 may be formed according to a variety of techniques. In one embodiment, the encapsulant body 122 is initially formed with the lower surface 126 of the encapsulant body 122 being completely planar, and the first, second and third openings 132, 134 and 138 are formed by removing encapsulant material from the lower surface 126, e.g., by etching or grinding. According to another example, the first, second and third openings 132, 134 and 138 openings are formed concurrently with the formation of the encapsulant body 122, e.g., through appropriate geometric configuration of a mold cavity in the case of a mold injection process.

Figure 2:
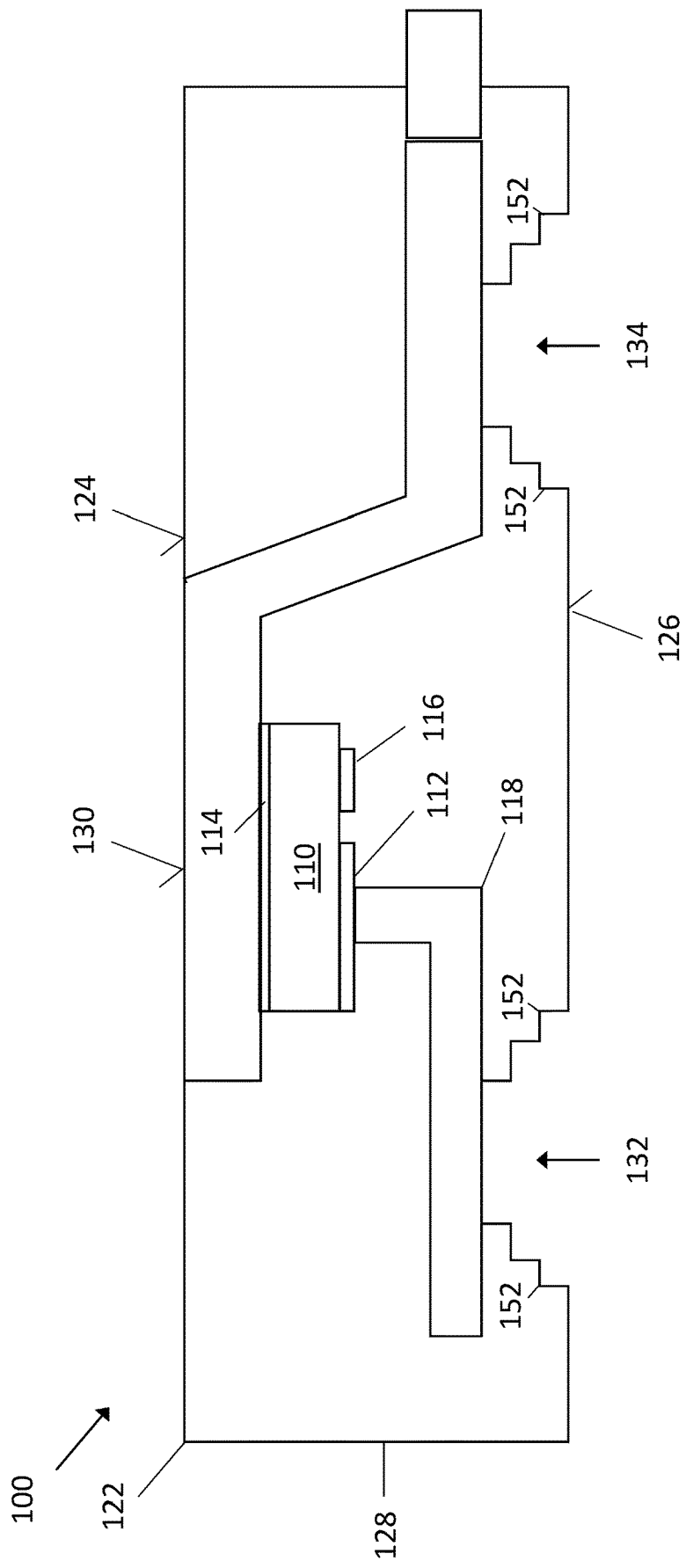
FIG. 2 depicts a semiconductor package from a side-view perspective with the interior elements being visible, according to another embodiment.

The semiconductor package 100 has an advantageous configuration with respect to creepage distance between voltage blocking terminals. Creepage distance refers to the shortest distance along electrically insulating material between two exposed conductive surfaces. As previously explained, the first terminal 112 and the second terminal 114 may be the voltage blocking terminals of the device. The creepage distance between the exposed conductive surfaces of the semiconductor package that are connected with these voltage blocking terminals may be measured between the outer surface 130 of the die pad 104 and the surface of the interconnect clip 118 that is exposed from the first opening 132. While FIG. 2 is not drawn to scale, it should be appreciated that the creepage distance measurement between the die pad 104 and the surface of the interconnect clip 118 can be shorter than the distance between the surface of the interconnect clip 118 that is exposed from the first opening 132 and the surface of the first lead 106 that is exposed from the second opening 134, and thus determine the creepage distance between the voltage blocking terminals of the device. The creepage distance of the semiconductor package 100 therefore comprises a first distance 140 between an end of the die pad 104 and the first outer edge side 128 along the upper surface 124, a second distance 142 between the upper surface 124 and the lower surface 126 along the first outer edge side 128, a third distance 144 between the first outer edge side 128 and the first opening 132 along the lower surface 126, and a fourth distance 146 between the lower surface 126 and the interconnect clip 118 along a first sidewall 136 of the first opening 132 that is nearest to the first outer edge side 128.

By configuring the semiconductor package 100 such that the first terminal 112 is electrically accessible via an opening on the lower surface 126 that is laterally offset from the first outer edge side 128, an advantageously large creepage distance is realized. This creepage distance advantageously includes the full length of the first outer edge side 128 of the encapsulant body 122 and the lateral separation distance between the first outer edge side 128 of the encapsulant body 122 and the first opening 132. By way of comparison, in a so-called surface mount type package, the leads protrude out from a sidewall of the package. Thus, if a die pad is exposed from the upper surface of the package, the creepage distance can only include a portion of the upper surface and a portion of the sidewall of the package between the upper surface and the package lead. The advantageous benefit in creepage distance between a surface mount type package and the presently disclosed embodiments can be demonstrated by the following numerical example. A surface mount type package with leads protruding out of the package sidewalls as described above may have a creepage distance between a source lead and a die pad exposed from an upper surface of the encapsulant body of about 3.15 mm (millimeters). A semiconductor package 100 according to the presently described embodiments which has an encapsulant body 122 of the same volumetric footprint and die pad arrangement may have a creepage distance of at least 5.0 mm, e.g., within a range of 5.5 mm to 6.0 mm, which translates to an improvement in creepage distance of at least 59%, e.g., within a range of 75% to 90%. These values merely represent one particular package configuration and more generally improvements in creepage distance are possible across a wide variety of package configurations.

As shown, the first leads 106 may optionally comprise a section that at least reaches an outer edge side of the encapsulant body 206 opposite from the first outer edge side 128. This section may correspond to a remnant lead frame section that is initially connected between the outer ring of a lead frame strip and the lead frame 102 and is trimmed after encapsulation. This section may be flush with the outer edge side of the encapsulant body 206 or may protrude slightly out (as shown). The second lead 108 may likewise have a similar configuration.

Referring to FIG. 1C, the semiconductor package may comprise a group of the first openings 132, wherein each of these first openings 132 are arranged in a row that is separated from the first outer edge side 128 by the same distance. In this way, a minimum creepage distance measured across the first outer edge side 128 is maintained for each one of the first openings. Moreover, the first openings 132 may be arranged so that the creepage distance measurement across a second outer edge side 148 that intersects the first outer edge side 128 is equal to or greater than the minimum creepage distance measured across the first outer edge side 128. For example, the first opening 132 that is closest to a second outer edge side 148 may be laterally spaced apart from the second outer edge side 148 by the same or greater distance as the first openings 132 are laterally spaced apart from the first outer edge side 128. The same principles may be applied with respect to the first opening 132 that is closest to a third outer edge side 150 that intersects the first outer edge side 128.

Referring to FIG. 1D, the die pad may be arranged to be surrounded by the upper surface 124 of the encapsulant body 122 in the every direction. The lateral separation distance between the exposed outer surface 130 of the die pad 104 and each one of the first, second and third outer edge sides 128, 148 and 150 may be selected to maintain a minimum creepage distance value. More generally, the geometries and locations of the first openings 132 on the lower surface 126 of the encapsulant body 122 and the location and geometry of the exposed die pad 104 on the upper surface 124 of the encapsulant body 122 may be selected to include advantageous lateral offsets with the edge sides of the package to maintain creepage distance, while balancing against other design considerations such as electrical conductivity and heat dissipation capacity.

Referring to FIG. 2, the semiconductor package 100 is depicted, according to an embodiment. The semiconductor package 100 of FIG. 2 is substantially identical to that of FIG. 1 with the exception of the geometry of the openings. In the embodiment of FIG. 2, the first and second openings 132, 134 have a tapered geometry such that the width of the first and second openings 132, 134 decreases moving away from the lower surface 126 of the encapsulant body 122. The third opening 138 (not shown) may have the same tapered geometry. The tapered geometry of the openings enables an increased thickness of the encapsulant body 122, which allows for an increased creepage distance by lengthening the outer edge sides.

According to the embodiment of FIG. 2, the first and second openings 132, 134 comprise step-shaped transitions. Each of these step-shaped transitions comprise an angled intersection 152 between planar surfaces of the encapsulant body 122. These angled intersections 152 may form perpendicular angles with one another between planar surfaces that are parallel and perpendicular to the lower surface 126 of the encapsulant body 122, for example. More generally, the angled intersections 152 may form oblique or acute angles and/or the surfaces forming the angled intersections 152 may be non-planar. By configuring the openings to comprise the step-shaped transitions, the insertion and secure fit of external connectors, which will be described in further detail below with respect to FIG. 8, is enhanced.

Figure 3:
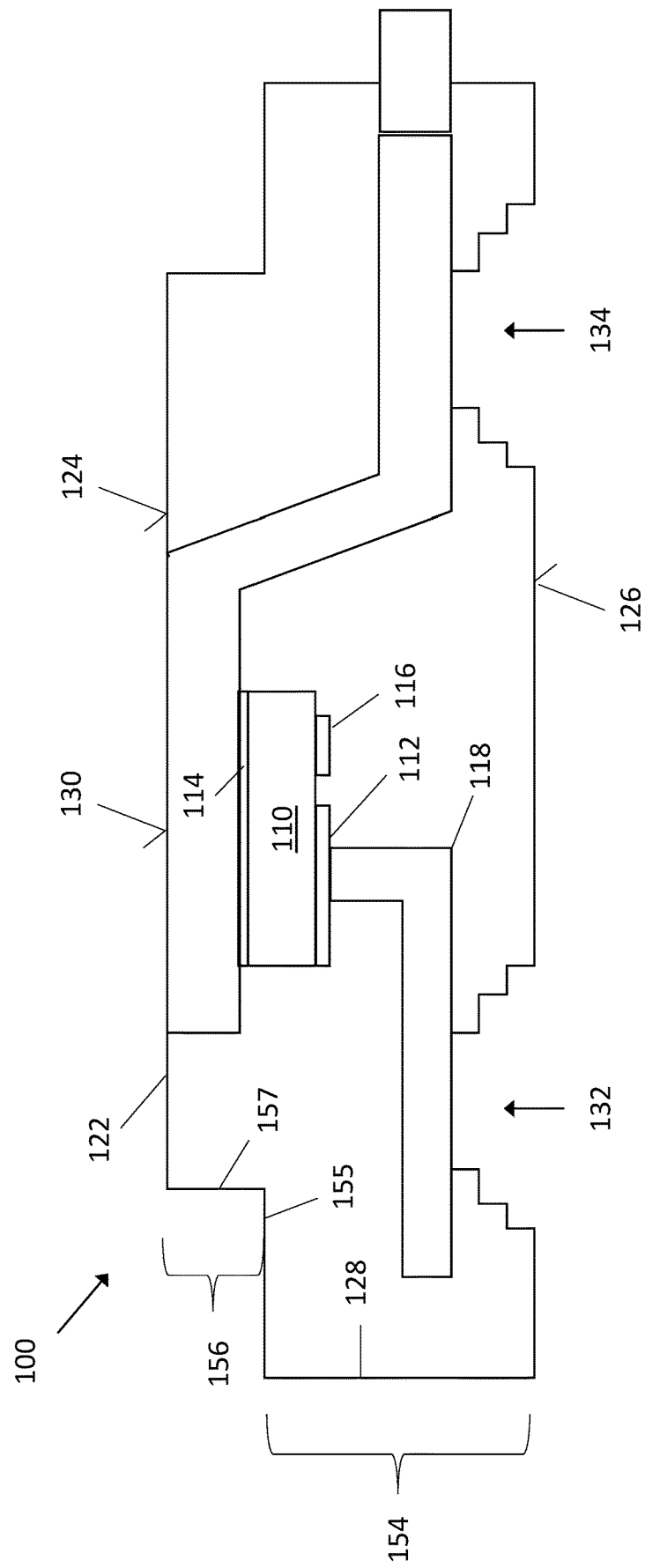
FIG. 3 depicts a semiconductor package from a side-view perspective with the interior elements being visible, according to another embodiment.

Referring to FIG. 3, the semiconductor package 100 is depicted, according to another embodiment. In this embodiment, the encapsulant body 122 comprises a wider section 154 and a narrower section 156 disposed on top of the wider section 154. The creepage distance between the exposed outer surface 130 of the die pad 104 and the exposed surface of the interconnect clip 118 comprises each of the surfaces of the encapsulant body 122 that form a transition between the wider section 154 and the narrower section 156. As shown, these surfaces comprise a first surface 155 and a second surface 157 which form a step-shaped transition between the wider section 154 and the narrower section 156. More generally, the surfaces of the encapsulant body 122 that form a transition between the wider section 154 and the narrower section 156 may comprise multiple step-shaped transitions, acute or obtuse angles, etc. The multi-width configuration of FIG. 4 allows for an increased creepage distance by increasing the thickness of the encapsulant body 122. Stated another way, the narrower section 156 allows for the die pad 104 to be moved further away from the lower surface 126 of the encapsulant body 122, thereby increasing the length of surfaces that contribute to the creepage distance.

Referring to FIG. 4, the semiconductor package 100 is depicted, according to another embodiment. In this embodiment, the interconnect clip 118 comprises a first section 158 that is electrically conductive and a second section 160 that is electrically insulating. The first section 158 comprises an electrically conductive material such as Cu (copper), Ni (Nickel), NiP (nickel phosphorous), Ag (Silver), Pd (palladium), Au (gold), etc., and alloys or combinations thereof. The second section 160 comprises an electrically insulating material that is suitable for semiconductor applications such as plastics, epoxy materials, glass materials, ceramics, etc. According to one embodiment, the first section 158 and the second section 160 are prefabricated. For example, the first section 158 may be formed from a planar sheet metal using standard metal processing techniques. Meanwhile, the second section 160 may be a molded plastic structure. The two prefabricated structures may be attached to one another, e.g., using glue, and the resultant interconnect clip 118 may be incorporated into the semiconductor package 100.

The first section 158 of the interconnect clip 118 is electrically connected to the first terminal 112 and comprises a surface that is exposed from the encapsulant body 122 by the first opening 132. Thus, the first section 158 of the interconnect clip 118 provides an externally accessible point of electrical contact in a similar manner as previously described. The second section 160 of the interconnect clip 118 contacts the lateral span of the first lead 106 that is vertically offset from the die pad 104, thereby mechanically coupling the interconnect clip 118 to the lead frame 102. The second section 160 of the interconnect clip 118 acts as a stabilization feature that improves the mechanical stability of the interconnect clip 118. Stated another way by anchoring the interconnect clip 118 to the lead frame 102, it is less likely to move or rotate during initial assembly, handling, and formation of the encapsulant body 22. The electrically insulating properties of the second section 160 maintain electrical isolation between the first terminal 112 and the second terminal 114 of the semiconductor die 110. As shown in FIG. 4A, the second section 160 of the interconnect clip 118 may comprise an enlarged section that spans across multiple ones of the second leads 108, thereby increasing the contact surface area and improving the mechanical coupling between the interconnect clip 118 and the lead frame 102.

Referring to FIG. 5, a semiconductor device assembly 200 is depicted, according to an embodiment. The semiconductor device assembly 200 comprises a circuit carrier 202. The circuit carrier 202 is a structure that is used to mechanically support multiple electronic components, e.g., semiconductor packages, passives, heat sinks, etc., and to accommodate electrical connections between these electronic components. The circuit carrier 202 may comprise an electrically insulating substrate with one or more structured metallization layers that provide bond pads and/or interconnect tracks. For example, the circuit carrier 202 may be a printed circuit board (PCB) that comprises an electrically insulating substrate formed from pre-peg material such as FR-4, CEM-1, G-10, etc. with bond pads and interconnect tracks formed by a structured metallization layer, e.g., a copper metallization layer. In another example, the circuit carrier 202 is a power electronics substrate. More particularly, the circuit carrier 202 may be a DBC (direct bonded copper) substrate that comprises an electrically insulating substrate formed of ceramic with bond pads and conductive tracks that are part of a structured metallization layer, e.g., a copper metallization layer, that is bonded to the ceramic material by an oxidation technique. In other embodiments, the circuit carrier 202 is another type of power electronics substrate such as an AMB (active metal brazed) substrate, or an IMS (insulated metal substrate) substrate, for example.

The semiconductor device assembly 200 further comprises a plurality of connectors 204. Each of the connectors 204 comprise an electrically conductive post 206 and an electrically insulating sleeve 208 that surrounds the electrically conductive post 206. The electrically conductive post 206 may comprise conductive metals such as Cu (copper), Ni (Nickel), NiP (nickel phosphorous), Ag (Silver), Pd (palladium), Au (gold), etc., and alloys thereof. According to an embodiment, the electrically conductive post 206 is a cylindrical post that comprises or is formed from Cu. The electrically insulating sleeve 208 be formed from electrically insulating materials suitable for semiconductor applications such as plastics, epoxy materials, glass materials, ceramics, etc. The electrically conductive post 206 can be securely attached to the electrically insulating sleeve 208, e.g., using an adhesive. Alternatively, the electrically conductive post 206 can be loosely inserted into the sleeve.

The connectors 204 are configured as points of electrical contact with the circuit carrier 202. For example, the connectors 204 may be electrically connected with bond pads from the circuit carrier 202, which in turn are electrically connected to conductive tracks in the circuit carrier 202. Alternatively, the connectors 204 may directly connect with conductive tracks in the circuit carrier 202 with bond pads from circuit carrier 202 being omitted. According to an embodiment, the connectors 204 are an integrally formed elements of the circuit carrier 202. This means that one or both of the electrically conductive post 206 and the electrically insulating sleeve 208 are part of a continuous structure that also forms the bond pads and/or substrate of the carrier. Alternatively, the connectors 204 can be discrete structures that are initially provided as separate structures from the circuit carrier 202 and subsequently attached, e.g., by soldering.

The semiconductor device assembly 200 further comprises the semiconductor package 100 as described above. While the depicted embodiment shows the semiconductor package 100 described with reference to FIG. 2, it shall be understood that the attachment concept to be described below is possible with any of the embodiments of the semiconductor package 100 described herein.

An attachment of the semiconductor package 100 to the circuit carrier 202 using the connectors 204 will now be described. As shown in FIG. 5A, the semiconductor packages 100 are arranged over the over the circuit carrier 202 such that the first and second openings 132, 134 are aligned with the connectors 204. As shown in FIG. 5B, the semiconductor packages 100 are arranged to be in the attached position by inserting the connectors 204 in the openings of the semiconductor packages 100. In the attached position, one of the connectors 204 is inserted in the first opening 132 and one of the connectors 204 is inserted in the second opening 204. Another one of the connectors 204 (not shown) may be inserted in the third opening 138 in a similar manner.

According to an embodiment, the connectors 204 are configured to be inserted into the openings in a form-fitting manner. This means that geometric features of the connectors 204, such as the width of the electrically insulating sleeve 208, the width of the electrically conductive post 206, and the height of the electrically conductive post 206 exposed from the electrically insulating sleeve 208 is compatible with the openings to form a mated connection with mechanical pressure. A conductive adhesive, such as solder, sinter, conductive glue, etc. may be used to ensure a mechanically and electrically reliable contact between the electrically conductive post 206 and the exposed conductive surfaces of the semiconductor package 100.

According to the depicted embodiment, the width of the electrically insulating sleeve 208 is such that, in the attached position, the electrically insulating sleeve 208 engages with the opposite facing sidewalls of the openings in the widest portion of the openings (e.g., as shown in FIG. 5B). The electrically conductive post 206 is narrower than the narrowest portion of the openings and has sufficient height exposed from the electrically insulating sleeve 208 so as to reach the exposed conductive surfaces of the semiconductor package 100 in the attached position. The semiconductor package 100 may rest upon the electrically insulating sleeve 208 in the attached position. Moreover, the form-fitting connection between the electrically insulating sleeve 208 and the openings may form protective seal that prevents conductive adhesive from bleeding out and potentially creating an electrical short.

The geometry of the connectors 204 and the openings shown in FIG. 5 is just one example of an arrangement wherein the connectors 204 can be inserted in the openings and form conductive connections with the exposed conductors of the semiconductor package 100. More generally, these two structures can be designed to have any complementary geometry so that a press-fit connection possible and/or so that a direct electrical connection is possible. For example, in the case that the semiconductor package 100 has the geometry of the openings described with reference to FIG. 1, the electrically conductive post 206 can have a similar or identical geometry as the openings. The height of the exposed portion of the electrically conductive post 206 can correspond to the depth of the openings so that the lower surface 126 of the encapsulant body 122 rests on the upper sides of the insulating sleeve. In addition or in the alternative, the electrically insulating sleeves 208 can be omitted altogether.

Figure 6:
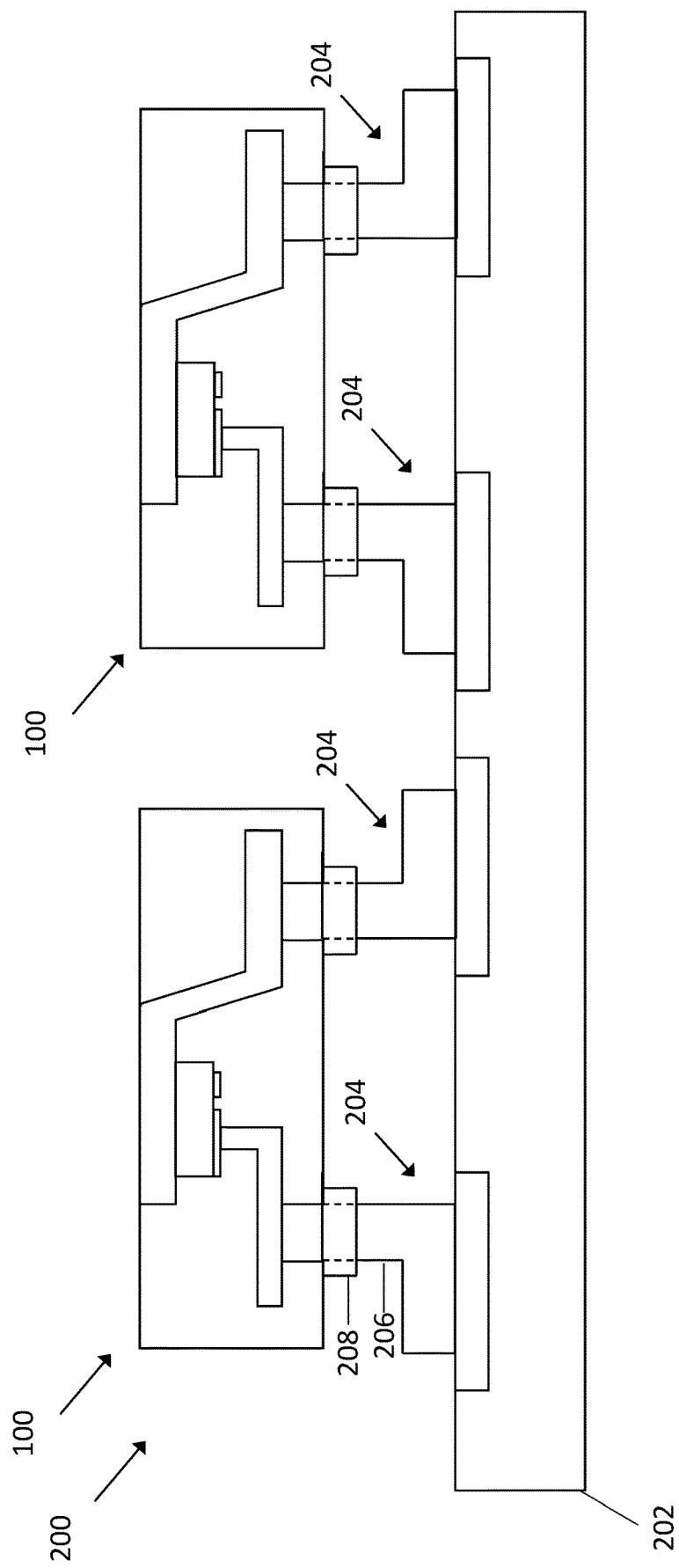
FIG. 6 depicts a semiconductor device assembly that comprises a circuit carrier, conductive connectors, and a semiconductor package, according to another embodiment.

Referring to FIG. 6, a semiconductor device assembly 200 is depicted, according to another embodiment. The semiconductor device assembly 200 comprises the circuit carrier 202 as described above. Additionally, the semiconductor device assembly 200 comprises semiconductor packages 100 according to the embodiment described with reference to FIG. 2. The semiconductor device assembly 200 additionally comprises connectors 204 providing the electrical connections between the semiconductor package 100s and the circuit carrier 202.

In the embodiment of FIG. 6, the connectors 204 are configured as standalone elements that are separate from the circuit carrier 202 and the semiconductor package 100. That is, the connectors 204 are not integrally formed features of either one of the semiconductor package 100 or the circuit carrier 202. Instead, the connectors 204 are attached and electrically connected to both the semiconductor package 100 or the circuit carrier 202 by a conductive adhesive, e.g., solder, sinter, conductive glue, etc. The connectors 204 comprise the electrically conductive post 206 and an the electrically insulating sleeve 208, each of which may have the same material composition as the connectors 204 described with reference to FIG. 5. Different to the previously described embodiment, the connectors 204 of FIG. 6 are designed to interface with the circuit carrier 202 in a similar manner as a lead from the leaded package. To this end, the conductive post 206 is exposed form the electrically insulating sleeve 208 at a lower side so that it may form an electrical contact with the circuit carrier 202.

Referring to FIG. 7, the semiconductor package 100 is shown before and after inserting connectors 204, wherein the connectors 204 are configured as standalone elements. As shown in FIG. 7A, the connectors 204 are initially provided separate from the semiconductor package 100 and interior ends of the connectors 204 are aligned with the openings. As shown in FIG. 7B, the connectors 204 are inserted in the openings to form electrical connections. The electrically conductive post 206 and the openings are dimensioned to have a form-fitting connection between the connectors 204 and the semiconductor package 100 in an attached position. Another one of the connectors 204 (not shown) may be inserted in the third opening 138 in a similar manner.

Referring to FIG. 8, the semiconductor package 100 is shown before and after inserting the connectors 204 that are configured as standalone elements, according to another embodiment. In the embodiment of FIG. 8, the connectors 204 have a straight configuration. As a result, the semiconductor package 100 can have a so-called through hole style package configuration when the connectors 204 are in the attached position. These types of packages are designed so that the leads (or in this case connectors 204) can be insertably received by correspondingly dimensioned receptacles in a circuit carrier. As can be appreciated from FIGS. 7 and 8, different package configurations can be obtained using the same basic package through customization of the connectors 204. More generally, a package footprint corresponding to wide variety of package types, e.g., DIP, TO, QFN, etc. may be obtained.

Figure 9A:
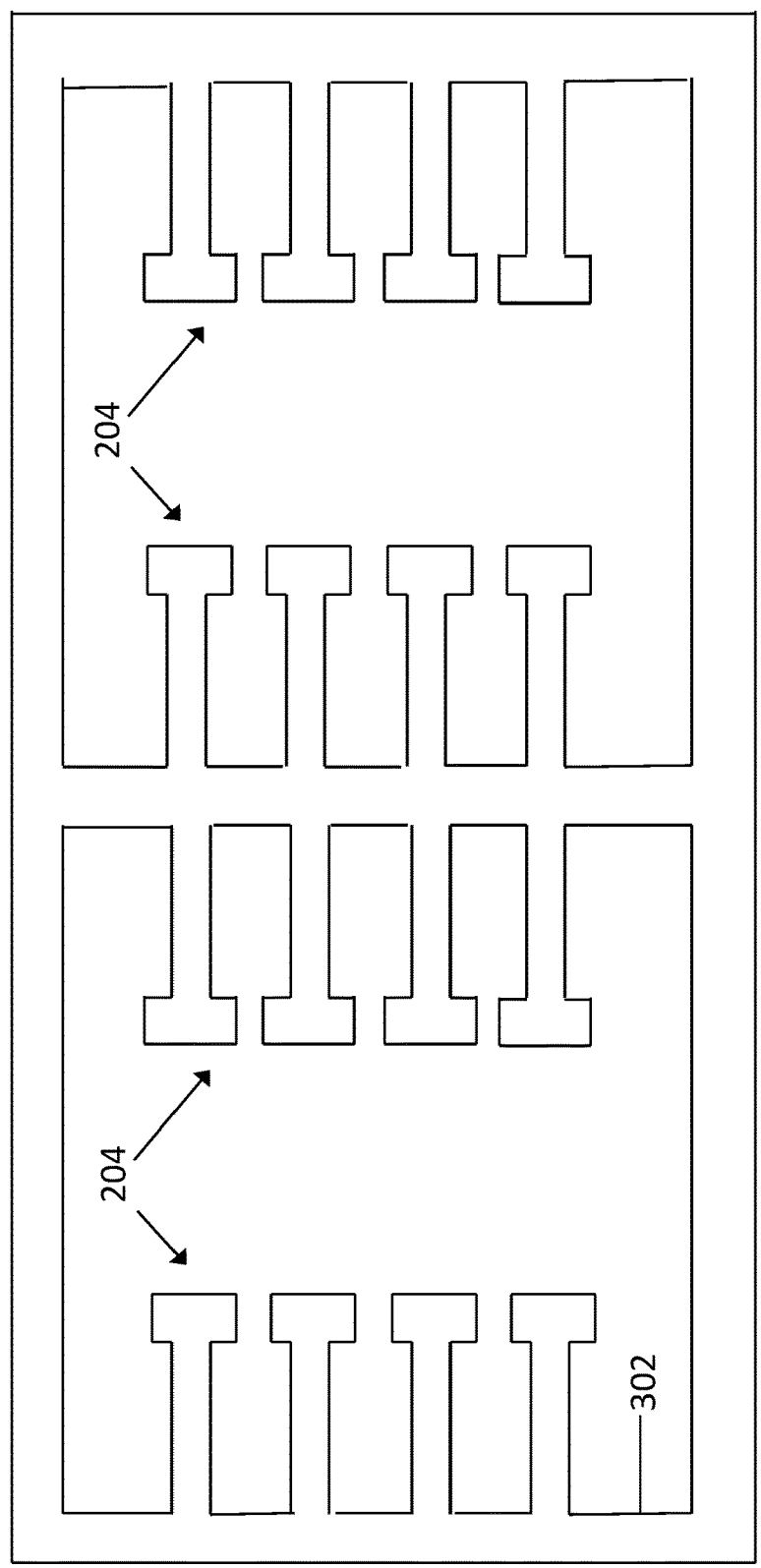
FIGS. 9A and 9B, depicts a method of forming a conductive connector.
Figure 9B:
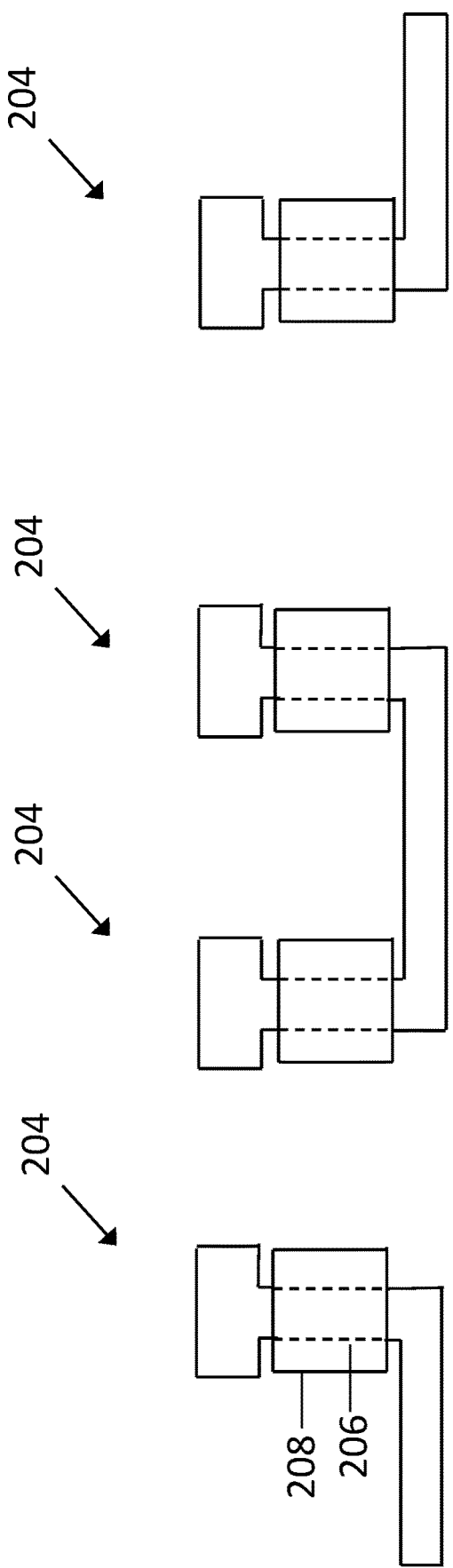

Referring to FIG. 9, a technique for forming the connectors 204 is depicted, according to an embodiment. As shown in FIG. 9A, the connectors 204 are formed by a metal structure 300 that is similar to a lead frame used to form a semiconductor package. This metal structure 300 may be formed from a planar sheet of metal that comprises an electrically conductive material such as Cu (copper), Ni (Nickel), NiP (nickel phosphorous), Ag (Silver), Pd (palladium), Au (gold), etc., and alloys or combinations thereof. The planar sheet is processed to form a plurality of conductive posts 206 extending away from a peripheral ring 302, e.g., using metal processing techniques such as stamping, punching, etc. The conductive posts 206 are severed from the peripheral ring 302. As shown in FIG. 9B, the separated conductive posts 206 may be bent, e.g., into a ninety degree angle. An additional cutting step (not shown) may be performed to separate connected conductive posts 206 from one another. Subsequently, the electrically insulating sleeves 208 are proved around the conductive posts 206. While the depicted embodiment shows connectors 204 having a similar configuration as the embodiment of FIG. 7, the lead frame technique of FIG. 9 is more generally applicable to any one of the conductive post configurations described herein.

Referring to FIG. 10, a process flow for forming the semiconductor package 100 and the connectors 204 in the attached position is depicted, according to an embodiment. In a first process step 402, a lead frame 102 comprising the die pad 104 and the leads is provided, and the semiconductor die 110 is mounted on the die pad 104. A conductive adhesive, e.g., solder, sinter, conductive glue, etc., can be provided between semiconductor die 110 and the die pad 104 to effectuate this connection. In a second process step 402, interconnects are formed. Forming the interconnects may include a wirebonding step to attach and electrically connect the bond wire 120 and a clip attach step to attach and electrically connect the interconnect clip 118, e.g., by soldering. In a third process step 404, a molding process is performed to form the encapsulant body 122. This may be done using a molding process such as injection molding, compression molding, transfer molding, etc. In a fourth process step 406, a tie-bar cutting step is performed. The tie-bar cuts severs a connection between the leads and an outer peripheral ring of the lead frame 102. In a fifth process step 408, a second plating process is performed. The second plating process forms a metal plating on the exposed metal surfaces of the semiconductor package 100 and the connectors 204. The second plating process may be performed using an electroless or electroplating technique. The metal plating can comprise a metal that protects exposed surfaces of the semiconductor package 100, e.g., tin. In a sixth process step 410, a final marking and trimming step is performed. In this process step, markings are etched in the package and the leads may be further trimmed and/or severed from one another.

According to another embodiment, process steps 400 to step 410 are performed so that a semiconductor package is made. This semiconductor package is sold as a standalone component to users, then the users will insert the separate connectors into the openings of the package for attaching the package to another substrate, like PCB or alike. In this alternative process, there is no need for steps 408-410.

Spatially relative terms such as "under," "below," "lower," "over," "upper" and the like, are used for ease of description to explain the positioning of one element relative to a second element. These terms are intended to encompass different orientations of the device in addition to different orientations than those depicted in the figures. Further, terms such as "first," "second," and the like, are also used to describe various elements, regions, sections, etc. and are also not intended to be limiting. Like terms refer to like elements throughout the description.

As used herein, the terms "having," "containing," "including," "comprising" and the like are open-ended terms that indicate the presence of stated elements or features, but do not preclude additional elements or features. The articles "a," "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A semiconductor package, comprising:
a die pad;
a semiconductor die mounted on the die pad and comprising a first terminal facing away from the die pad and a second terminal facing and electrically connected to the die pad;
an interconnect clip electrically connected to the first terminal;
an encapsulant body of electrically insulating material that encapsulates the semiconductor die and the interconnect clip; and
a first opening in the encapsulant body that exposes a surface of the interconnect clip,
wherein the encapsulant body comprises a lower surface, an upper surface opposite from the lower surface, and a first outer edge side extending between the lower surface and the upper surface,
wherein the first opening is laterally offset from the first outer edge side
wherein an outer surface of the die pad is exposed from the upper surface,
wherein a creepage distance between the outer surface of the die pad and the exposed surface of the interconnect clip comprises a distance along a first sidewall of the first opening that is nearest to the first outer edge side.

2. The semiconductor package of claim 1, wherein an end of the outer surface of the die pad is laterally spaced apart from the first outer edge side, and wherein the creepage distance between the outer surface of the die pad and the exposed surface of the interconnect clip further comprises the distance between the end of the outer surface die pad and the first outer edge side along the upper surface, a distance between the upper surface and the lower surface along the first outer edge side, and a distance between the first outer edge side and the first opening along the lower surface.

3. The semiconductor package of claim 2, wherein the encapsulant body comprises a wider section and a narrower section on top of the wider section, and wherein the creepage distance comprises a distance along one or more surfaces of the encapsulant body that form a transition between the wider section and the narrower section.

4. The semiconductor package of claim 2, wherein the semiconductor package further comprises:
   a first conductive lead that is continuously connected to the die pad and comprises a lateral span that is vertically offset from the die pad; and
   a second opening in the encapsulant body that exposes a surface of the first lead in the lateral span, and
   wherein the second opening extends from the lower surface into the encapsulant body.

5. The semiconductor package of claim 4, wherein the encapsulant body comprises a second outer edge side extending between the lower surface and the upper surface and opposite from the first outer edge side, and wherein the second opening is laterally offset from the second outer edge side.

6. The semiconductor package of claim 5, wherein the first and second openings each comprise opposite facing sidewalls, wherein the sidewalls of the first and second openings comprise one or more step-shaped transitions, and wherein each of the one or more step-shaped transitions comprise an angled intersection between planar surfaces of the encapsulant body.

7. The semiconductor package of claim 4, wherein the interconnect clip comprises a first section that is electrically conductive and a second section that is electrically insulating, wherein the first section is electrically connected to the first terminal and comprises the surface that is exposed by the first opening, and wherein the second section contacts the lateral span of the first conductive lead.

8. The semiconductor package of claim 1, wherein the first sidewall comprises one or more step-shaped transitions, and wherein each of the one or more step-shaped transitions comprise an angled intersection between planar surfaces of the encapsulant body.

9. The semiconductor package of claim 1, wherein the semiconductor die is a discrete power device, and wherein the first terminal and the second terminal are voltage blocking terminals of the semiconductor die.

10. A semiconductor device assembly, comprising:
    a semiconductor package, comprising:
    a die pad;
    a semiconductor die mounted on the die pad and comprising a first terminal facing away from the die pad and a second terminal facing and electrically connected to the die pad;
    an interconnect clip electrically connected to the first terminal;
    an encapsulant body of electrically insulating material that encapsulates the semiconductor die and the interconnect clip; and
    a first opening in the encapsulant body that exposes a surface of the interconnect clip; and
    a first connector that is attachable to the semiconductor package, and
    wherein the first connector is configured be inserted in the first opening and form a conductive connection with the surface of the interconnect clip that is exposed from the encapsulant body in an attached position,
    wherein the first connector comprises an electrically conductive post that contacts the surface of the interconnect clip in the attached position,
    wherein the first connector further comprises an electrically insulating sleeve that surrounds the electrically conductive post, and wherein in the attached position the electrically insulating sleeve engages with the opposite facing sidewalls of the first opening.

11. The semiconductor device assembly of claim 10, wherein the first opening comprises opposite facing sidewalls, wherein the opposite facing sidewalls comprise one or more step-shaped transitions, wherein each of the one or more step-shaped transitions comprise an angled intersection between planar surfaces of the encapsulant body, and wherein the electrically insulating sleeve engages with the opposite facing sidewalls in a widest portion of the first opening.

12. The semiconductor device assembly of claim 10, wherein the encapsulant body comprises a lower surface, an upper surface opposite from the lower surface, and a first outer edge side extending between the lower surface and the upper surface, wherein an outer surface of the die pad is exposed from the upper surface of the encapsulant body, and wherein a creepage distance between the outer surface of the die pad that is exposed from the encapsulant body and the exposed surface of the interconnect clip comprises the distance between the outer surface of the die pad and the first outer edge side along the upper surface, a distance between the upper surface and the lower surface along the first outer edge side, and a distance between the first outer edge side and the first opening along the lower surface.

13. The semiconductor device assembly of claim 10, further comprising a circuit carrier that comprises an electrically insulating substrate and a structured metallization layer, and wherein the first connector forms an electrical connection between the interconnect clip and the structured metallization layer.

14. The semiconductor device assembly of claim 13, wherein the first connector is an integrally formed element of the circuit carrier.

15. The semiconductor device assembly of claim 13, wherein the first connector is a standalone element that is separate from the circuit carrier and the semiconductor package.

16. The semiconductor device assembly of claim 10, wherein the semiconductor package further comprises a first conductive lead that is continuously connected to the die pad and comprises a lateral span that is vertically offset from the die pad, and a second opening in the encapsulant body that exposes a surface of the lateral span, wherein the semiconductor device assembly further comprises a second connector that is attachable to the semiconductor package and comprises a second electrically conductive post, and wherein the second connector is configured be inserted in the second opening and form a second conductive connection with a surface of the first conductive lead in the attached position.

17. A semiconductor device assembly, comprising:
    a semiconductor package, comprising:
    a die pad;
    a semiconductor die mounted on the die pad and comprising a first terminal facing away from the die pad and a second terminal facing and electrically connected to the die pad;
    an interconnect clip electrically connected to the first terminal;

an encapsulant body of electrically insulating material that encapsulates the semiconductor die and the interconnect clip; and
a first opening in the encapsulant body that exposes a surface of the interconnect clip; and
a first connector that is attachable to the semiconductor package, and
wherein the first connector is configured to be inserted in the first opening in a form fitting manner and form a conductive connection with the surface of the interconnect clip that is exposed from the encapsulant body in an attached position.

\* \* \* \* \*

UNITED STATES PATENT AND TRADEMARK OFFICE
CERTIFICATE OF CORRECTION

PATENT NO. : 11,652,078 B2  
APPLICATION NO. : 17/234964  
DATED : May 16, 2023  
INVENTOR(S) : E. Cabatbat et al.

Page 1 of 1

It is certified that error appears in the above-identified patent and that said Letters Patent is hereby corrected as shown below:

In the Claims

Column 14, Line 58 (Claim 1, Line 19), please change "side" to -- side, --.

Column 16, Line 1 (Claim 10, Line 17), please change "configured be" to -- configured to be --.

Column 16, Line 55 (Claim 16, Line 10), please change "configured be" to -- configured to be --.

Signed and Sealed this
Eighteenth Day of July, 2023

Katherine Kelly Vidal
*Director of the United States Patent and Trademark Office*